US011081187B2

(12) United States Patent
Sharma et al.

(10) Patent No.: US 11,081,187 B2
(45) Date of Patent: Aug. 3, 2021

(54) ERASE SUSPEND SCHEME IN A STORAGE DEVICE

(71) Applicant: SanDisk Technologies LLC, Addison, TX (US)

(72) Inventors: Sahil Sharma, San Jose, CA (US); Phil Reusswig, San Jose, CA (US); Rohit Sehgal, San Jose, CA (US); Piyush A. Dhotre, San Jose, CA (US); Niles Yang, San Jose, CA (US)

(73) Assignee: SanDiskTechnologies LLC

( * ) Notice: Subject to any disclaimer, the term of this patent is extended or adjusted under 35 U.S.C. 154(b) by 64 days.

(21) Appl. No.: 16/710,526

(22) Filed: Dec. 11, 2019

(65) Prior Publication Data

US 2021/0183450 A1   Jun. 17, 2021

(51) Int. Cl.
| | |
|---|---|
| *G11C 16/16* | (2006.01) |
| *G11C 16/26* | (2006.01) |
| *G11C 16/34* | (2006.01) |
| *G11C 16/08* | (2006.01) |
| *G11C 16/30* | (2006.01) |

(52) U.S. Cl.
CPC .............. *G11C 16/16* (2013.01); *G11C 16/08* (2013.01); *G11C 16/26* (2013.01); *G11C 16/30* (2013.01); *G11C 16/349* (2013.01); *G11C 16/3472* (2013.01)

(58) Field of Classification Search
CPC ... G11C 16/16; G11C 16/349; G11C 16/3472; G11C 16/26; G11C 16/30; G11C 16/08
See application file for complete search history.

(56) References Cited

U.S. PATENT DOCUMENTS

| 5,687,121 A * | 11/1997 | Lee ........................... | G11C 8/10 |
| | | | 365/185.11 |
| 5,805,501 A * | 9/1998 | Shiau ..................... | G11C 16/16 |
| | | | 365/185.29 |
| 6,137,729 A * | 10/2000 | Choi ...................... | G11C 16/16 |
| | | | 365/185.29 |
| 6,189,070 B1 * | 2/2001 | See ......................... | G11C 16/10 |
| | | | 365/218 |
| 8,130,550 B1 * | 3/2012 | Confalonieri .......... | G11C 16/16 |
| | | | 365/185.11 |
| 10,643,711 B1 * | 5/2020 | Yuan ...................... | G11C 16/26 |

(Continued)

*Primary Examiner* — Jay W. Radke
(74) *Attorney, Agent, or Firm* — Dickinson Wright PLLC; Steven Hurles

(57) ABSTRACT

A method of operating a storage device, including; performing, by a non-volatile memory, an erase operation on a block of memory in the non-volatile memory, where the non-volatile memory is coupled to a controller; receiving, by the non-volatile memory, a host-transaction within a first time period, where, the non-volatile memory is coupled to a host device; and suspending, by the non-volatile memory, an erase operation in response to receiving the host-transaction by: determining the erase operation has completed a charge phase; and suspending the erase operation during a pulse phase of the erase operation. The method additionally includes the non-volatile memory maintaining a loop counter and a pulse counter, where: the loop counter increments in response to completion of an erase loop, and the pulse counter increments in response to completion of an erase pulse, where the erase pulse is applied during a pulse phase of the erase operation.

20 Claims, 5 Drawing Sheets

(56) References Cited

U.S. PATENT DOCUMENTS

| | | | | |
|---|---|---|---|---|
| 2004/0264257 | A1* | 12/2004 | Hamaguchi | G11C 16/10 365/210.1 |
| 2008/0276050 | A1* | 11/2008 | Hsieh | G11C 16/16 711/154 |
| 2010/0290292 | A1* | 11/2010 | Tanizaki | G11C 16/3445 365/185.22 |
| 2011/0055453 | A1* | 3/2011 | Bennett | G11C 16/32 711/103 |
| 2012/0057410 | A1* | 3/2012 | Yu | G11C 16/16 365/185.29 |
| 2012/0254515 | A1* | 10/2012 | Melik-Martirosian | G06F 12/0246 711/103 |
| 2013/0198451 | A1* | 8/2013 | Hyun | G11C 16/225 711/114 |
| 2014/0047167 | A1* | 2/2014 | Kwak | G11C 16/10 711/103 |
| 2014/0181426 | A1* | 6/2014 | Grunzke | G06F 12/0246 711/154 |
| 2016/0141038 | A1* | 5/2016 | An | G11C 16/30 365/185.12 |
| 2017/0262229 | A1* | 9/2017 | Ochi | G06F 3/0679 |
| 2018/0004421 | A1* | 1/2018 | Kang | G06F 3/0611 |
| 2018/0129445 | A1* | 5/2018 | Shin | G06F 3/0679 |
| 2019/0220219 | A1* | 7/2019 | Um | G06F 3/0679 |
| 2019/0244673 | A1* | 8/2019 | Yang | G11C 16/08 |

* cited by examiner

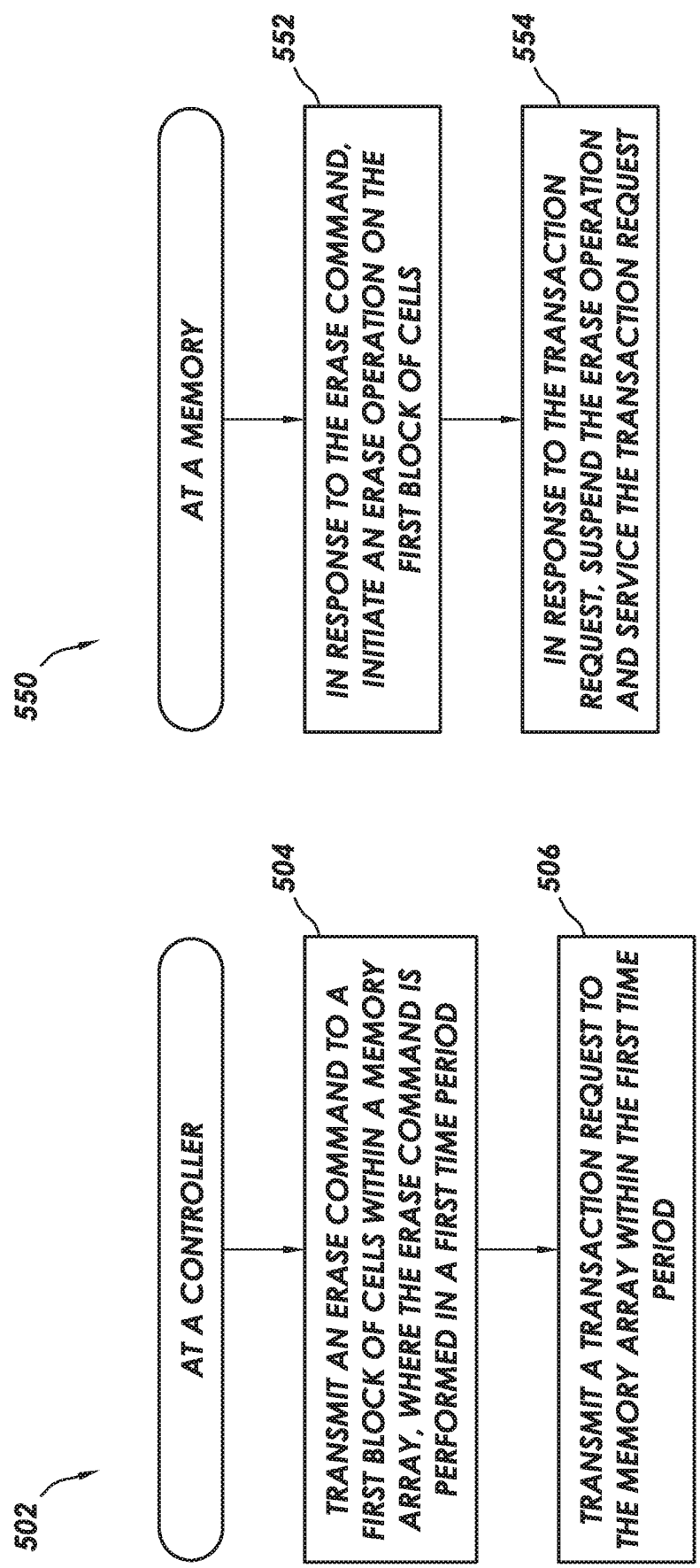

ERASE SUSPEND SCHEME IN A STORAGE DEVICE

BACKGROUND

The present technology relates to the operation of memory devices. Semiconductor memory devices are widely used in various electronic devices such as laptops, digital audio players, digital cameras, cellular phones, video game consoles, scientific instruments, industrial robots, medical electronics, solid state drives, automotive electronics, Internet of Things (IOT) devices and universal serial bus (USB) devices.

A memory device can be coupled to one or more hosts, where one or more interfaces are used to access the memory device. Additionally, the memory device is often managed by a controller, where among several roles, the controller is configured to interface between the host and the memory device.

In various embodiments, a host controller interface and storage protocol is implemented between the controller and the memory device to accelerate the transfer of data between enterprise and client systems and solid-state drive (SSD) or other flash based hard drives. The host controller interface and storage protocol often supports features such as predictable latency that enables a particular memory device to operate within certain quality of service (QOS) specifications.

SUMMARY

Various embodiments include a storage device including: a non-volatile memory coupled to a controller; the non-volatile memory defining: a memory array; and control circuits; wherein, the controller is configured to: transmit an erase command to a first block of cells within the memory array, wherein the erase command is performed in a first time period; and transmit a transaction request to the memory array within the first time period. Furthermore, the non-volatile memory is configured to: in response to the erase command, initiate an erase operation on the first block of cells; and in response to the transaction request, suspend the erase operation and service the transaction request.

Other embodiments include a method of operating a storage device, including: performing, by a non-volatile memory, an erase operation on a block of memory in the non-volatile memory, where the non-volatile memory is coupled to a controller; receiving, by the non-volatile memory, a host-transaction with a first time period, where, the non-volatile memory is coupled to a host device; and suspending by the non-volatile memory, an erase operation in response to receiving the host-transaction. The suspending further includes: determining the erase operation has completed a charge phase; and suspending the erase operation during a pulse phase of the erase operation.

Additional embodiments include a system including: a host coupled to a memory; the memory defining: a memory array; and control circuits configured to access the memory array; a controller coupled to the memory, where the controller operates as an interface between the host and the memory where the controller is configured to: transmit an erase command to a first block of cells within the memory array, where the erase command is performed in a first time period; and transmit a transaction request to the memory array within the first time period. The memory is additionally configured to: in response to the erase command, initiate an erase operation on the first block of cells; and in response to the transaction request, suspend the erase operation and service the transaction request.

BRIEF DESCRIPTION OF THE DRAWINGS

For a detailed description of example embodiments, reference will now be made to the accompanying drawings in which:

FIG. 5A is a flow chart illustrating a method, in accordance with some embodiments, and FIG. 5B is a flow chart illustrating a method, in accordance with other embodiments.

DETAILED DESCRIPTION

Figure 1:
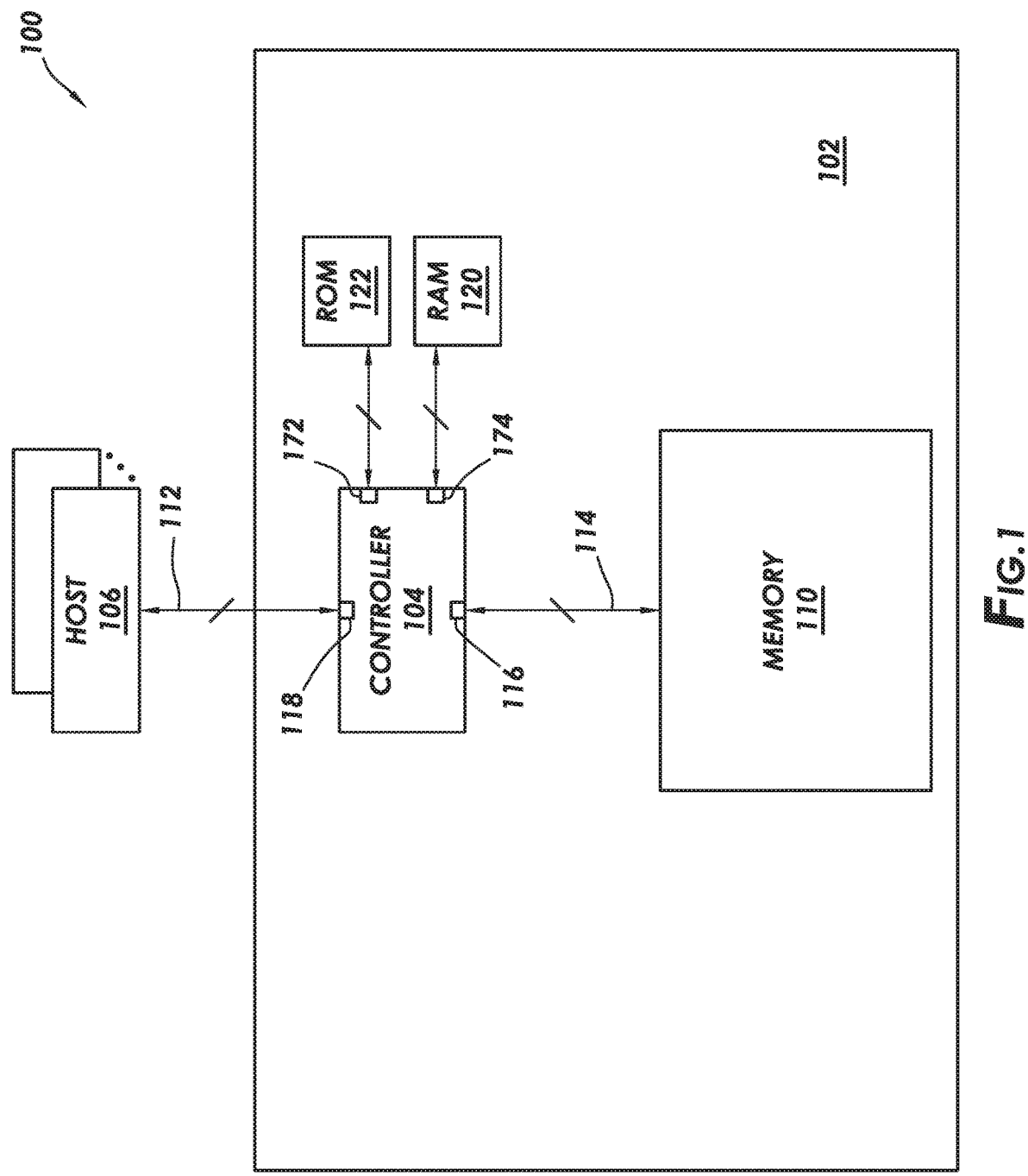
FIG. 1 is a block diagram of an example non-volatile memory system, in accordance with some embodiments.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in can be directly on the other layer of substrate, or intervening layers may also be present. Further, it will be understood that when a layer is referred to as being "under" another layer, it can be directly under, and one or more intervening layers may also be present. Furthermore, when a layer is referred to as "between" two layers, it can be the only layer between the two layers, or one or more intervening layers may also be present.

As described herein, a controller includes individual circuit components, an application-specific integrated circuit (ASIC), a microcontroller with controlling software, a digital signal processor (DSP), a processor with controlling software, a field programmable gate array (FPGA), or combinations thereof.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

In various embodiments, a controller includes individual circuit components, an application-specific integrated circuit (ASIC), a microcontroller with controlling software, a digital signal processor (DSP), a processor with controlling software, a field programmable gate array (FPGA), or combinations thereof.

As described herein, methods of operating a storage device include: a non-volatile memory performing an erase operation on a block of memory in the non-volatile memory, where the non-volatile memory is coupled to a controller. In particular, the non-volatile memory manages the suspension of the erase operation in order to meet quality of service (QOS) requirements.

In one example, the methods further include receiving, by the non-volatile memory, a host-transaction within a first time period, where the non-volatile memory is coupled to a host device; and suspending, by the non-volatile memory, an erase operation in response to receiving the host-transaction by: determining the erase operation has completed a charge phase; and suspending the erase operation during a pulse phase of the erase operation.

Specifically, as described herein, instead of a controller tracking when an erase operation may be suspended, the memory itself, manages suspending the erase operation. By moving the erase suspension management to the memory and off the controller, essentially a smarter memory is proposed. Furthermore, controller resources may be dedicated to other tasks.

An additional benefit of the memory managing the suspension of the erase operation is the memory knows an exact status of the erase operation. For example, control circuits within the memory can track or sense voltage amounts applied to a block of memory being erased. By sensing the voltage amounts, the memory can discern whether a memory is within a charge phase of an erase operation or within a pulse phase of the erase operation.

In another example, the memory can be configured to set a bit upon entering the pulse phase of the erase operation. The memory may sense whether the erase operation has entered a pulse phase based on the bit. The above implementations of the memory sensing a state of the erase operation are meant to be illustrative and not limiting. Any method of the memory tracking a state of the erase operation is contemplated by this disclosure.

In contrast, when a state of the erase operation is tracked by a controller, host, firmware, and the like, the state of the erase operation is inferred or guessed. For example, a controller may transmit an erase command and set a timer to guess when the memory has exited a charge phase of an erase operation. However, the memory may in reality exit the charge phases sooner than or later than anticipated (as tracked by the timer).

By moving the management of the erase operation to the memory itself, more accurate management of the erase operation is possible as the memory directly senses a state of the erase operation. Thus the memory is capable of suspending the erase operation upon sensing that the erase operation has exited a charge phase and servicing a host-transaction. Thus, the memory operates in a more efficient manner.

The description turns to describing an example memory system and then turns to various aspects associated with suspending an erase operation. In particular, FIGS. 1 and 2 describe aspects of an example memory system, while FIGS. 3-5 describes aspects of the memory suspending an erase operation in order to meet quality of service (QOS) requirements.

FIG. 1 is a block diagram of an example system architecture 100 including non-volatile memory "NVM" array 110 (hereinafter "memory 110"). In particular, the example system architecture 100 includes storage device 102 where a host 106 is communicatively coupled to the memory 110 by way of a controller 104. Although a single host 106 is used for illustrative purposes, the controller 104 may be coupled to several hosts, where some or all of the hosts access the memory 110.

Example embodiments of the storage device 102 include an internal storage drive (e.g., a notebook hard drive, a desktop hard drive), a removable mass storage device (e.g., a secure digital (SD) card, a micro secure digital (micro-SD) card, or a multimedia card (MMC), or a universal serial bus (USB) device). Additional examples of the storage device 102 include mass storage devices (e.g., an eSD/eMMC embedded flash drive), or any type of internal storage device, removable storage device, embedded storage device, external storage device, or network storage device.

To operate, the storage device 102 may use controller logic (e.g., the controller 104) as well as flash memory circuits. The controller 104 interfaces to the host 106 using a high-bandwidth bus 112 (by way of port 118), additionally the controller 104 is communicatively coupled to the memory 110 by bus 114 (by way of port 116). The port 116 of the controller can include one or several channels coupling the memory 110, respectively. Furthermore, the buses 112 and 114 are implemented by several channels (e.g., physical connections). The depiction of a single bus is not meant to be limiting as one or more connections and interfaces can be used to communicatively couple the same components.

In some examples, the bus 112 implements any known or after developed communication protocol that enables the storage device 102 and the host 106 to communicate. Some non-limiting examples of a communication protocol include Serial AT attachment, PCI Express (PCIe), or their variants (mini-PCIe, M.2, etc.). In some examples, the interface 114 implements any known or after developed communication protocol. In embodiments where the storage device 102 is flash memory, the interface 114 is a flash interface, e.g., Toggle Mode 200, 400, or 800, Common Flash Memory Interface (CFI) or NVM Express (NVMe).

In some embodiments, the controller 104 supports a data buffer implemented in fast memory (e.g., DRAM) to balance relatively slow performance of erase and write operations by individual chips. In FIG. 1, the controller 104 is coupled to a random access memory (RAM) 120 (by RAM port 174)

and a read only memory (ROM) 122 (by ROM port 172). Although in FIG. 1 the RAM 120 and the ROM 122 are shown as separate modules within the storage device 102, in some embodiments, the RAM 120 and the ROM 122 are located within the controller 104. In other cases, portions of the RAM 120 or ROM 122, can be located outside the controller 104. In other embodiments, the controller 104, the RAM 120, and the ROM 122 are located on separate semiconductor die.

The memory 110 of the storage device 102 includes several memory die, where a memory die can be defined in various ways. In one example, the memory 110 defines a physical set of memory die. In other embodiments, the memory 110 defines a logical set of memory die, where the memory 110 includes memory die from several physically different sets of memory die.

The memory 110 includes memory cells defined within the memory die that can be solid-state memory cells (e.g., flash), one-time programmable, few-time programmable, or many time programmable. Additionally, the memory cells in the memory die 110 can include single-level cells (SLC), multi-level cells (MLC), or triple-level cells (TLC). In some embodiments, the memory cells are fabricated in a planar manner (e.g., 2D NAND (NOT-AND) flash) or in a stacked or layered manner (e.g., 3D NAND flash). Furthermore, the memory cells can use charge-storing material such as floating gate or a charge-trapping material, where stored charge represents a data state.

In various embodiments, the host 106 includes any device or system that utilizes the storage device 102—e.g., a computing device, a memory card, a flash drive. In some example embodiments, the storage device 102 is embedded within the host 106—e.g., a solid state disk (SSD) drive installed in a laptop computer. In additional embodiments, the system architecture 100 is embedded within the host 106 such that the host 106 and the storage device 102 including the controller 104 are formed on a single integrated circuit chip. In embodiments where the system architecture 100 is implemented within a memory card, the host 106 can include a built-in receptacle or adapters for one or more types of memory cards or flash drives (e.g., a universal serial bus (USB) port, or a memory card slot).

Figure 2:
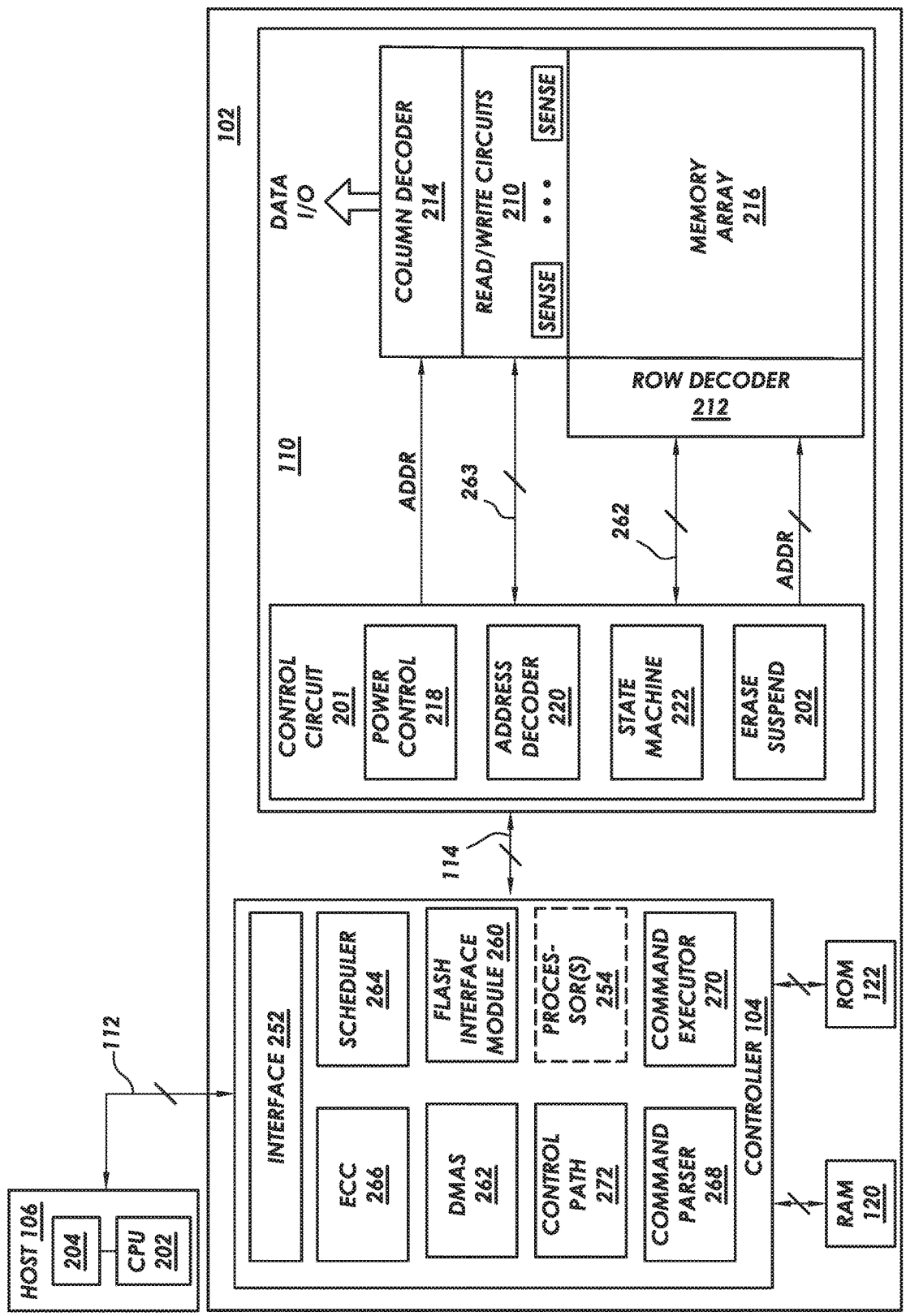
FIG. 2 is a block diagram of an example memory system, in accordance with some embodiments.

Although, the storage device 102 includes its own memory controller and drivers (e.g., controller 104)—described further in FIG. 2—the example described in FIG. 1 is not meant to be limiting. Other embodiments of the storage device 102 include memory-only units that are instead controlled by software executed by a controller on the host 106 (e.g., a processor of a computing device controls—including error handling of—the storage device 102). Additionally, any method described herein as being performed by the controller 104 can also be performed by the controller of the host 106.

Still referring to FIG. 1, the host 106 includes its own controller (e.g., a processor) configured to communicate with the storage device 102. Data originating from the host 106 that is stored in the storage device 102 is referred to herein as "host data". The host data includes data originating from and pertaining to applications executing on the host 106.

In one example, the host 106 accesses host data stored in the storage device 102 by providing a logical address to the controller 104 which the controller 104 converts to a physical address. The controller 104 accesses the data or particular storage location associated with the physical address and facilitates transferring data between the storage device 102 and the host 106.

In embodiments where the storage device 102 includes flash memory, the controller 104 interfaces between a host and the memory 110 and accesses the memory 110 as described herein. Furthermore, the controller 104 formats the flash memory to ensure the memory is operating properly, maps out bad flash memory cells, and allocates spare cells to be substituted for future failed cells or used to hold firmware to operate the flash memory controller (e.g., the controller 104).

Furthermore, due to charge leakage, data read from the storage device 102 is verified against error correction code (ECC). If errors are detected, the corrected bit values are computed and written back to the storage. The controller 104 also periodically checks for data that has been residing a long time in storage without being accessed to verify it is viable (e.g., data scrubbing).

Thus, the controller 104 accesses the memory and also performs various memory management functions such as, wear leveling (e.g., distributing writes to extend the lifetime of the memory blocks), garbage collection (e.g., moving valid pages of data to a new block and erasing the previously used block), and error detection and correction (e.g., read error handling).

The technology described herein can also be utilized with technologies in addition to the charge trapping and floating gate flash memory described herein. For example, in addition to flash memory (e.g., 2D and 3D NAND-type and NOR-type flash memory), examples of non-volatile memory include ReRAM memories, magnetoresistive memory (e.g., MRAM), and phase change memory (e.g., PCRAM). A person of ordinary skill in the art will recognize that this technology is not limited to a single specific memory structure, but covers many relevant memory structures within the spirit and scope of the technology as described herein and as understood by one of ordinary skill in the art.

FIG. 2 is a block diagram of one embodiment of the system 100, including the host 106 and the storage device 102 including the memory 110. The host 102 utilizes the memory 110 to write and read data, where the memory 110 is used for long-term data storage.

In one example, the host 106 includes a central processing unit (CPU) 202 connected to a host memory space 204, such as DRAM or other main memories. In various embodiments, application programs are stored within the host memory space 204, where components of the host 160 execute the application programs.

The host 106 interfaces (by way of bus 112) with the transaction/data link/physical layers specific to an interface 252 of the controller 104. In one example, the storage device 102 is coupled to the host 106 through a switch or a bridge. In FIG. 2, the controller 104 may include one or more processors 254, including multi-core processors. The processor 254 is configured to handle the components of the memory 110 through firmware code.

In one example, the controller 104 operates using an NVM Express (NVMe) protocol. The NVMe protocol is a communications interface/protocol developed for solid state drives (SSDs) where in some examples, the storage device 102 is coupled to the host 106 by way of a PCIe interface. The NVMe protocol provides to the host 106, a command queue and completion path to access data stored in the storage device 102.

The controller 104 is coupled to memory 110 through a flash interface module 260. The flash interface module 260 handles communication with the memory 110. The controller 104 executes computer-readable program code (e.g., software or firmware), executable instructions that are executed by various components of the controller 104 including the processor 254, logic gates, switches, application specific integrated circuits (ASICs), programmable logic controllers, embedded microcontrollers, and other components of the controller 104. The instructions may be stored in a non-transitory computer readable storage medium. Examples of a non-transitory computer readable storage medium include read-only memory or memory 110.

Instructions stored in the storage device 102 may be executed without added input or directions from the host 106. In other embodiments, the instructions are transmitted from the host 106. The controller 104 and memory 110 are configured with hardware and instructions to perform the various functions described herein and shown in the figures.

The controller 104 also includes other components, such as a direct memory access DMA module 262, a scheduler 264, an error correction module 266, a command parser 268, a command executor 270, and a control path 272. The DMA module 262 executes data transfers between the host 106 and the storage device 102, without involving the CPU 202. The scheduler 264 controls the data transfer while activating the control path for fetching physical region pages (PRPs), posting completion and interrupts, and activating the DMAs for the actual data transfer between the host 106 and the storage device 102. Error correction module 266 corrects the data fetched from the memory 110. Command parser 268 parses commands to command executor 270, which is executed through the flash interface module 260.

During operation of the storage device 102, the storage device 102 receives a transaction request—e.g., a read request or a write request—from the host 106 (also referred to herein as a "host-transaction"). In order to meet certain quality of service (QOS) requirements defined for certain types of transaction, the storage device 102 is configured to suspend operations that are not monitored as part of the QOS requirements.

In various embodiments, QOS requirements may be specified by the host 106. In one example, a QOS requirement defines a latency for a specific command size. For example, a QOS requirement may define that for commands having a size of 4 kilobytes, ninety-nine percent of the time, the command is processed within 300 microseconds. In order to meet QOS requirements, the storage device 102 is configured to suspend background operations—e.g., an erase operation—in order to service a command that falls within the QOS requirements—e.g., a read or write operation.

The management of suspending an erase operation in order to service a read or write request is handled by the memory 110. In particular, instead of firmware within the controller 104 managing the suspension of the erase operation, the erase suspend circuit 202 manages the suspension of the erase operation. In the example memory 110, the erase suspend circuit 202 is implemented within the control circuit 201.

In various embodiments, the memory 110 includes the control circuit 201, read/write circuits 210, a row decoder 212, a column decoder 214, and a memory array 216. The example control circuit 201, within the memory 110, additionally includes a power control circuit 218, an address decoder 220, and a state machine 222.

The various circuits within the example control circuit 201 may be referred to herein as "managing circuits." The control circuit 201 and its various managing circuits, are communicatively coupled by various interfaces (e.g., interfaces 262 and 263) to the row decoder 212 and the column decoder 214. In various embodiments, the control circuit 201 performs various operations on the memory array 216 that include reading or writing to the memory cells. The read/write circuits 210 read and program pages of memory within the memory 110, in parallel. Additionally, the memory array 216 is accessed by word line via the row decoder 212 and by bit lines via the column decoder 214.

The power control circuit 218 controls the power and voltage supplied to the word lines and bit lines during operation of the memory array 216. The address decoder 220 provides an address interface that translates addresses between addresses provided by the host 106 and addresses used by the row decoder 212 and the column decoder 214. For example, the address decoder 220 converts an address provided by the host 106 to an address that is understood and compatible with a format used by the row decoder 212 and the column decoder 214. The state machine 222 provides chip-level control of memory operations.

The erase suspend circuit 202 suspends an ongoing erase operation based on an erase state of a block of memory in the memory array 216. The manner in which the erase suspend circuit 202 operates is different from a firmware timer that may be used to infer a state of the block being erased in the memory 110. In particular, the erase suspend circuit 202 can determine whether an erase operation is in a charge phase or a pulse phase of the erase operation. The erase suspend circuit 202 suspends the erase operation based on a phase of the erase operation and before a read or write transaction is performed.

Specifically, in some examples, the erase suspend circuit 202 increases the voltage of word-lines coupled to a block of memory cells to be erased to an erase voltage threshold. When an erase operation is suspended, the word-lines coupled to the block of memory cells remain at the erase voltage threshold amount. That is, during the suspension of the erase operation, the erase suspend circuit 202 maintains the voltage of the word-lines applied during the pulse phase.

By implementing the management of the erase operation within the memory itself, more accurate management of the erase operation is possible as the memory directly senses or determines a state of the erase operation. Thus the memory is capable of suspending the erase operation upon sensing that the erase operation has exited a charge phase and services a host-transaction; the memory operates in a more efficient manner.

Figure 3:
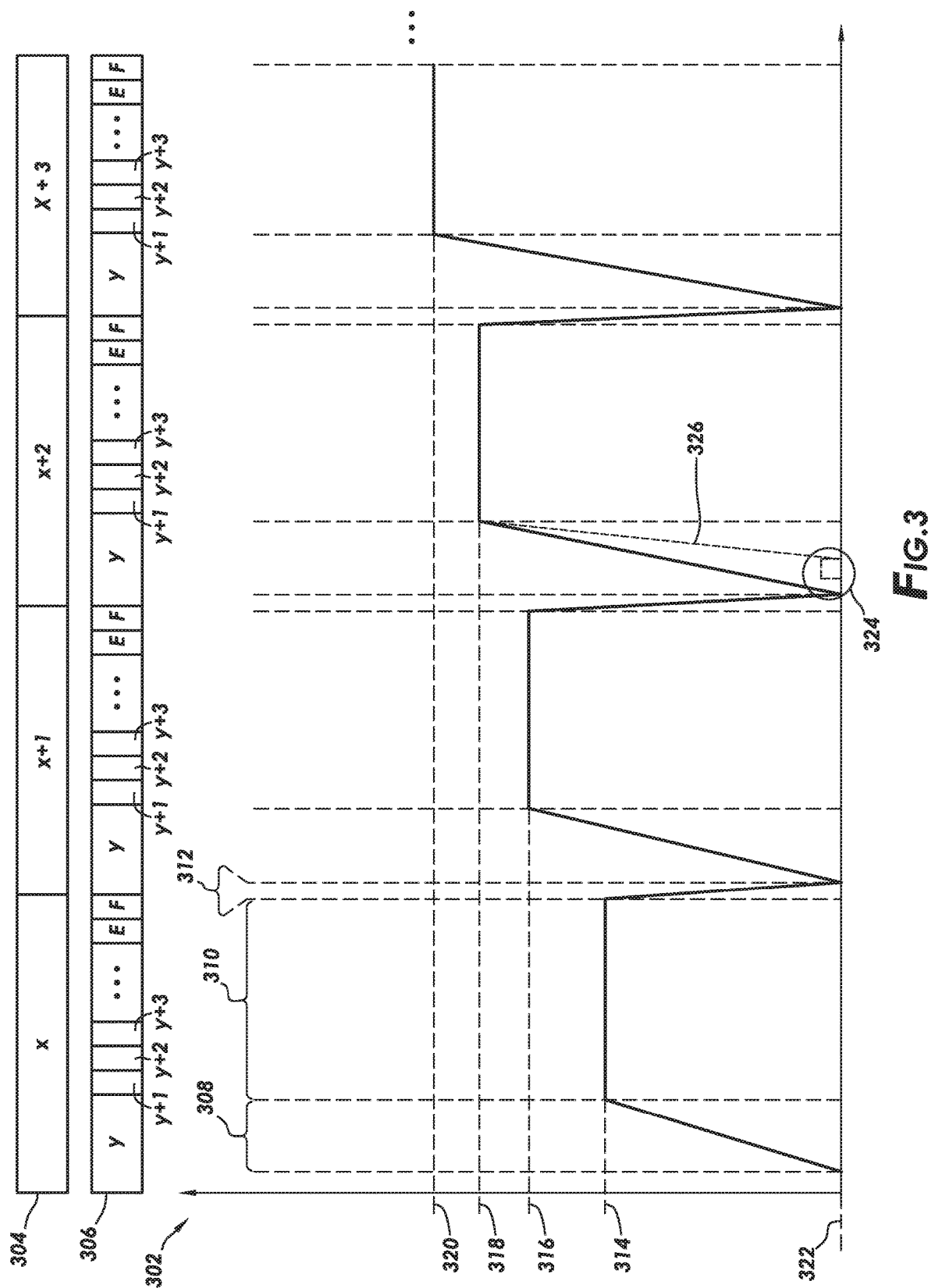
FIG. 3 is a timing diagram associated with an erase operation, in accordance with some embodiments.

FIG. 3 illustrates a plot of voltages associated with an erase operation. The example erase operation can take between five to fifteen milliseconds to complete. The plot 302 illustrates an erase operation in which loops of erase and verify are performed. The number of loops performed during the erase operation may be tracked by a loop counter 304, wherein during a first loop the loop counter has a value x, during a second loop, the loop counter has a value x+1, during a third loop, the loop counter has a value x+2, and during the fourth loop, the loop counter has a value x+3.

With respect to counters, examples for tracking a number (e.g., of loops or pulses) as described herein, is not meant to be limiting. On the contrary, tracking a number can take any form without departing from the scope of this disclosure. For example, to track a number of loops, a counter can be set to an initial value, such as zero, or any other initial value, for example −5, 20, 0.5, and the like. The counter may track a number by setting a pointer at an initial position and progressively moving the pointer in a given direction such that the counter is incremented or decremented each time an erase loop completes. For purposes of this disclosure, the term "advance" as pertaining to a counter includes both incrementing and decrementing the counter.

Furthermore, the counters as described herein may be implemented in various aspects of the memory 110. In one example the counters are implemented within the controller circuit 201 (e.g., within the erase suspend circuit 202).

Within each loop of the erase operation, several erase pulses maybe applied. In addition to the loop counter, a pulse counter 306 tracks the number of erase pulses applied during a respective loop. In addition to tracking the number of erase pulse, the pulse counter 306 may also designate a value to track a charge phase of a respective erase loop and a discharge phase of the respective erase loop.

For example, when an erase loop begins, the voltage applied to a block (e.g., the word lines) are increased during the charge phase 308. In one example the voltage applied to the block is a first voltage level 314, where the voltage ramps up to the first voltage level 314 during the charge phase 308. The example erase pulse has an initial value y during the charge phase 308.

Subsequently, after the charge phase 308 is complete and during the pulse phase 310 the pulse counter 306 tracks the number of erase pulses applied during the respective erase loop. During the pulse phase 310, the pulse counter 306 has values y+1, y+2, and y+3, etc. Finally at the end of the erase loop and after the pulse phase 310, the erase loop enters a discharge phase 312.

During the discharge phase 312 the voltage applied to the block drops to an initial voltage level 322. During the discharge phase, both the pulse counter 306 and the loop counter 304 change values. The pulse counter 306 may be set to an initial value again (e.g., value y) while the loop counter 304 advances to a subsequent value, to track another erase loop in the erase operation.

In the example shown in FIG. 3, four erase loops are illustrated and in each of the erase loops, a different voltage level (e.g., erase voltage threshold) is applied to the block. For example, in the first erase loop, the voltage is ramped up to the first voltage level 314, in the second erase loop, the voltage is ramped up to a second voltage level 316. In the third erase loop, the voltage is ramped up to a third voltage level 318, and in the fourth erase loop, the voltage is ramped up to a fourth voltage level 320.

Additionally, in some examples, a verify operation is performed during the charge phase of an erase loop. For example, in the FIG. 3, a voltage pulse 324 associated with a verify operation is applied during the beginning of the third erase loop. In this example, when a voltage pulse 324 is applied, the voltage is subsequently ramped up—e.g., voltage ramp 326—to the third voltage level 318. In one example, the verify operation is not performed in the first two loops and is performed in the subsequent loops following the first two.

In various embodiments, the erase suspend circuit 202 may determine to suspend an erase operation based on various factors including the memory array 216 receiving a read or write operation (e.g., a host-transaction). The erase suspend circuit 202 is configured to suspend the example erase operation when the erase operation is operating in a pulse phase.

For example, the erase suspend circuit 202 may determine that a read operation is received at time t0 by the memory array 216. At time t0 an erase operation may also be in the middle of being performed on a particular memory block. In one example where the particular memory block is in the charge phase, the control circuit 201 does not suspend the erase operation until the erase operation is in the pulse phase. Instead, the control circuit 201 waits to suspend the erase operation when the erase operation has entered a pulse phase or is in a discharge phase.

As part of the determination of when to suspend an erase operation, the memory may access counter information to determine a state of the erase operation. For example, if at time t0, the memory receives a host-transaction request, the memory checks the pulse counter to determine a state of the erase operation. If the pulse counter has a value of "y", the memory determines the state of the erase operation is in a charge phase and the memory refrains from suspending the erase operation. Upon determining the pulse counter has advanced to the value "y+1", the memory subsequently determines to suspend the erase operation (at a time subsequent to time t0).

Alternatively, if at time t0, the memory determines the value of the pulse counter is not an initial value (e.g., the value of the pulse counter is not "y"), the memory may determine to proceed with suspending the erase operation. Accordingly, when a read or write transaction is received by the memory array 216, the memory array 216 manages suspending an erase operation.

During the suspension of the erase operation, the voltage to the word-lines of the particular memory block remain at the voltage level for a particular erase loop (e.g., voltage levels, 314, 316, 318, or 320). Upon resuming the erase operation, the memory does not repeat the charge phase of the particular erase loop as the voltages on the word-line were maintained.

From the perspective of the controller 104, the controller may transmit an erase operation and also transmit a read or write transaction without keeping track of a phase of the erase operation. Instead the memory array 216 and the controller circuit 201 (FIG. 2) manage and coordinate when an erase operation is suspended in order to service the read or write transaction.

By implementing the management of the erase operation within the memory itself, more accurate management of the erase operation is possible as the memory directly senses a state of the erase operation. Thus the memory is capable of suspending the erase operation upon sensing that the erase operation has exited a charge phase and servicing a host-transaction; the memory operates in a more efficient manner.

Figure 4:
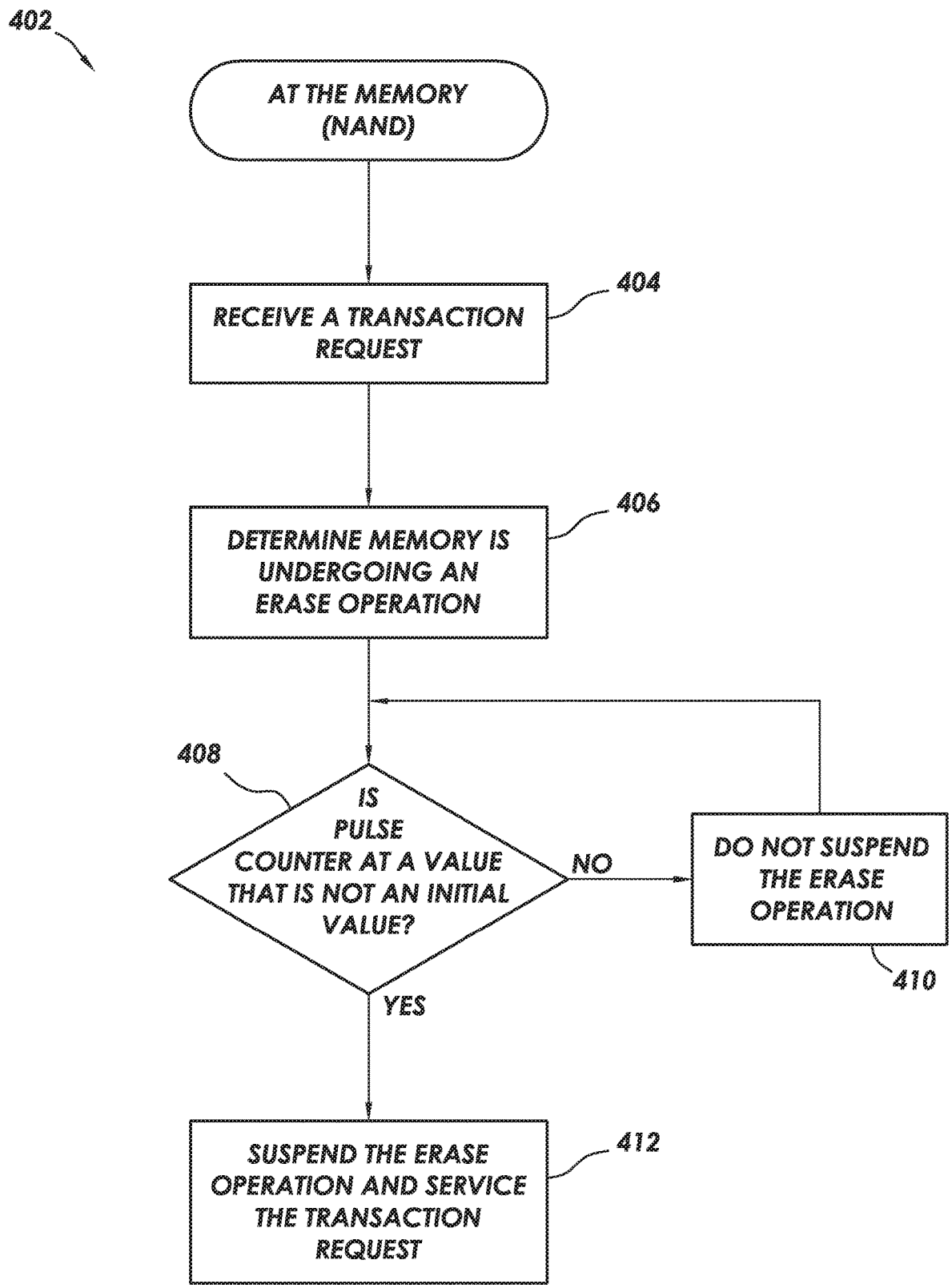
FIG. 4 is a flow chart illustrating a method, in accordance with some embodiments.

FIG. 4 illustrates a method 402 in accordance with various embodiments. The method may be performed by any suitable memory components in any suitable memory design, such as the one discussed in FIG. 1 or 2, that supports managing a host transaction in a manner discussed. In various embodiments, some of the blocks shown in FIG. 4 may be performed concurrently, in a different order than shown, or omitted. Additional method elements may be performed as desired.

Specifically, the method 402 is performed at the memory (e.g., NAND) and begins with the memory receiving a transaction (e.g., host-transaction) request (block 404). In one example the controller 104 transmits the transaction request during a first time period where during the first time period the controller 104 also transmits an erase command. That is, from the perspective of the controller 104, the controller 104 does not track whether the memory is performing an erase operation, instead the controller 104 asynchronously transmits the erase command and the transaction request.

Upon receiving the transaction request, the memory determines whether an erase operation is being performed in the memory (block 406). In one example, the memory makes a determination as to whether the pulse counter is at a value that is not an initial value (decision block 408). For example, when the pulse counter is at an initial value the erase operation is within a charge phase. The memory waits for the erase operation to enter the pulse phase before suspending the erase operation to service the transaction request.

Accordingly, if the memory determines the pulse counter is at an initial value, the memory does not suspend the erase operation (block 410) and checks again at a subsequent time to see whether the pulse counter is at a value that is not an initial value (block 408). The memory may be set up in any known manner to determine when the pulse counter has advanced beyond an initial value. For example, the memory may check the value of the pulse counter periodically. In another example, the pulse counter may transmit a signal to the control circuit 201 when advancing to a value beyond the initial value.

If the memory determines the pulse counter is not at an initial value, the memory suspends the erase operation and services the transaction (e.g., host-transaction) request (e.g., a read operation) (block 412). In various embodiments, when the memory suspends the erase operation, the memory maintains a voltage level of the word-lines coupled to the block at a level obtained at the end of the charge phase. For example, referring back to FIG. 3, the memory may suspend the erase operation applied to a block during the pulse phase 310. While the erase operation is suspended, the memory maintains the voltage level at the first voltage level 314. Accordingly, when the memory operation resumes, the memory does not undergo another charge phase to perform the erase operation on the block. Thereafter the method ends. Accordingly, the management of suspending an erase operation is performed within the memory itself, as opposed to handled by firmware within a host or controller.

FIG. 5A illustrates a method 502 in accordance with various embodiments. The method may be performed by any suitable memory components in any suitable memory design, such as the one discussed in FIG. 1 or 2, that supports managing a host transaction in a manner discussed. In various embodiments, some of the blocks shown in FIG. 5A may be performed concurrently, in a different order than shown, or omitted. Additional method elements may be performed as desired.

Specifically, the method is performed at a controller—e.g., the controller 104. Initially, the controller transmits an erase command to a first block of cells within the memory array, where the erase command is performed in a first time period (block 504). Next, the controller transmits a transaction request to the memory array within the first time period (block 506).

Thus, the controller 104 transmits the erase command and the transaction request asynchronously. That is, the controller 104 transmits both commands without monitoring or without consideration of a state of the memory as the controller responds to the erase command or the transaction request.

FIG. 5B illustrates a method 550 in accordance with various embodiments. The method may be performed by any suitable memory components in any suitable memory design, such as the one discussed in FIG. 1 or 2, that support managing a host transaction in a manner discussed. In various embodiments, some of the blocks shown in FIG. 5B may be performed concurrently, in a different order than shown, or omitted. Additional method elements may be performed as desired.

Specifically, the method is performed within a memory—e.g., memory 110. Initially, the memory receives the erase command (e.g., transmitted in block 504, FIG. 5A), and in response to the erase command, initiates an erase operation on the first block of cell (block 552). Next the memory receives the transaction request (e.g., transmitted in block 506, FIG. 5A) and in response to the transaction request, suspends the erase operation and services the transaction request (block 554). Thereafter, the method ends.

The above discussion is meant to be illustrative of the principles and various embodiments described herein. Numerous variations and modifications will become apparent to those skilled in the art once the above disclosure is fully appreciated. For example, although a controller 104 has been described as performing the methods described above, any processor executing software within a host system can perform the methods described above without departing from the scope of this disclosure. In particular, the methods and techniques described herein as performed in the controller, may also be performed in a host, where the host accesses memory space of the controller. Furthermore, the methods and concepts disclosed herein may be applied to other types of persistent memories other than flash. It is intended that the following claims be interpreted to embrace all such variations and modifications.

What is claimed is:

1. A storage device comprising:
  a non-volatile memory coupled to a controller, the non-volatile memory comprising:
    a memory array; and
    control circuits;
  wherein, the controller is configured to:
    transmit an erase command to a first block of cells within the memory array, wherein the erase command is performed in a first time period; and
    transmit a transaction request to the memory array within the first time period, and wherein the non-volatile memory is configured to:
    in response to the erase command, initiate an erase operation on the first block of cells;
    in response to the transaction request, suspend the erase operation and service the transaction request; and
    determine a charge phase of the erase operation is complete when the non-volatile memory suspends the erase operation in response to the transaction request.

2. The storage device of claim 1, wherein during the erase operation, the non-volatile memory is further configured to:
  charge word-lines coupled to the first block of cells to an erase voltage threshold during the charge phase of the erase operation;
  maintain the erase voltage threshold during a pulse phase of the erase operation; and
  refrain from charging the word-lines to the first block to the erase voltage threshold during a discharge phase of the erase operation.

3. The storage device of claim 2, wherein when the non-volatile memory suspends the erase operation in response to the transaction request, the non-volatile memory is configured to:
  maintain a voltage level of the word-lines coupled to the first block at a level obtained at the end of the charge phase.

4. The storage device of claim 2, wherein the non-volatile memory is further configured to:
  maintain a loop counter and a pulse counter, wherein:
    the loop counter increments in response to completion of an erase loop, and
    the pulse counter increments in response to completion of an erase pulse, wherein the erase pulse is applied during a pulse phase of the erase operation.

5. The storage device of claim 4, wherein when the non-volatile memory suspends the erase operation in response to the transaction request, the non-volatile memory is configured to:
- determine the charge phase is complete, wherein the loop counter is equal to an initial value; and
- suspend the erase operation during the pulse phase of the erase operation.

6. The storage device of claim 1, wherein when the non-volatile memory suspends the erase operation, the non-volatile memory is configured to suspend the erase operation based on a state of the erase operation within the non-volatile memory and not based on a timer.

7. The storage device of claim 1, wherein the controller is configured to transmit the erase command and the transaction request in an asynchronous manner.

8. A method of operating a storage device, comprising:
- performing, by a non-volatile memory, an erase operation on a block of memory in the non-volatile memory, wherein the non-volatile memory is coupled to a controller;
- receiving, by the non-volatile memory, a host-transaction within a first time period, wherein the non-volatile memory is coupled to a host device; and
- suspending, by the non-volatile memory in response to receiving the host-transaction, an erase operation by:
  - determining the erase operation has completed a charge phase; and
  - suspending the erase operation during a pulse phase of the erase operation.

9. The method of claim 8, wherein performing the erase operation further comprises, the non-volatile memory:
- charging word-lines coupled to a the block of memory to an erase voltage threshold during the charge phase of the erase operation;
- maintaining the erase voltage threshold during a pulse phase of the erase operation; and
- refraining from charging the word-line to the block to the erase voltage threshold during a discharge phase of the erase operation.

10. The method of claim 9, wherein suspending the erase operation further comprises, the non-volatile memory maintaining a voltage level of the word-lines coupled to the block at a level obtained at the end of the charge phase.

11. The method of claim 9, further comprising, the non-volatile memory maintaining a loop counter and a pulse counter, wherein:
- the loop counter increments in response to completion of an erase loop, and
- the pulse counter increments in response to completion of an erase pulse, wherein the erase pulse is applied during a pulse phase of the erase operation.

12. The method of claim 11, wherein suspending the erase operation in response to receiving the host-transaction further comprises:
- determining the charge phase is complete, wherein the loop counter is equal to an initial value; and
- suspending the erase operation during the pulse phase of the erase operation.

13. The method of claim 8, wherein when the non-volatile memory suspends the erase operation, the non-volatile memory is configured to suspend the erase operation based on a state of the erase operation within the non-volatile memory and not based on a timer.

14. A system comprising:
- a host;
- a memory coupled to the host, the memory comprising:
  - a memory array; and
  - control circuits configured to access the memory array;
- a controller coupled to the memory, wherein the controller operates as an interface between the host and the memory, wherein the controller is configured to:
  - transmit an erase command to a first block of cells within the memory array, wherein the erase command is performed in a first time period; and
  - transmit a transaction request to the memory array within the first time period, wherein the memory is configured to:
    - in response to the erase command, initiate an erase operation on the first block of cells;
    - in response to the transaction request, suspend the erase operation and service the transaction request; and
    - determine a charge phase of the erase operation is complete when the memory suspends the erase operation in response to the transaction request.

15. The system of claim 14, wherein during the erase operation, the memory is further configured to:
- charge word-lines coupled to the first block of cells to an erase voltage threshold during the charge phase of the erase operation;
- maintain the erase voltage threshold during a pulse phase of the erase operation; and
- refrain from charging the word-lines to the first block to the erase voltage threshold during a discharge phase of the erase operation.

16. The system of claim 15, wherein when the memory suspends the erase operation in response to the transaction request, the non-volatile memory is configured to:
- maintain a voltage level of the word-lines coupled to the first block at a level obtained at the end of the charge phase.

17. The system of claim 15, wherein the memory is further configured to:
- maintain a loop counter and a pulse counter, wherein:
  - the loop counter increments in response to completion of an erase loop, and
  - the pulse counter increments in response to completion of an erase pulse, wherein the erase pulse is applied during a pulse phase of the erase operation.

18. The system of claim 17, wherein when the memory suspends the erase operation in response to the transaction request, the memory is configured to:
- determine the charge phase is complete, wherein the loop counter is equal to an initial value; and
- suspend the erase operation during the pulse phase of the erase operation.

19. The system of claim 14, wherein when the memory suspends the erase operation, the memory is configured to suspend the erase operation based on a state of the erase operation within the memory and not based on a timer.

20. The system of claim 14, wherein the controller is configured to transmit the erase command and the transaction request in an asynchronous manner.

* * * * *